US006100701A

United States Patent [19]

Hoy et al.

[11] Patent Number: 6,100,701

[45] Date of Patent: Aug. 8, 2000

[54] IGNITION COIL CURRENT MONITORING

[75] Inventors: Alan Hoy, Chelmsford; Jon Dixon, Maldon, both of United Kingdom

[73] Assignee: Ford Motor Company, Dearborn, Mich.

[21] Appl. No.: 09/088,813

[22] Filed: Jun. 2, 1998

[30] Foreign Application Priority Data

Jun. 2, 1997 [GB] United Kingdom .................... 9711242

[51] Int. Cl.[7] .............................. F02P 17/10; G01R 31/06

[52] U.S. Cl. ........................... 324/546; 324/388; 324/537

[58] Field of Search ..................................... 324/378, 388, 324/503, 509, 522, 537, 546, 547

[56] References Cited

U.S. PATENT DOCUMENTS

| | | | |
|---|---|---|---|
| 4,165,481 | 8/1979 | Wells et al. | 324/378 |
| 5,283,527 | 2/1994 | DeBiasi | 324/388 |
| 5,507,264 | 4/1996 | Kugler et al. | 324/388 X |

*Primary Examiner*—Glenn W. Brown
*Attorney, Agent, or Firm*—Mark L. Mollon

[57] ABSTRACT

The present invention relates to the monitoring of current drawn by an ignition coil for a spark ignition engine, and in particular to circuitry and a method for detecting a malfunction in the charging of an ignition coil or its associated drive circuitry. The electronic circuit comprises: circuitry to measure the voltage of a battery (VB) for charging the coil; software (52) to determine according to the measured battery voltage (VB) a nominal dwell time (TC) for charging fully the coil prior to discharge of the coil; circuitry (32,34) to measure an amount of current drawn by the coil over a time less than the time taken to charge fully the coil; software (36) to extrapolate from the measured current a calculated expected dwell time TD to charge fully the coil; and a device to indicate an error condition (44,62,64,66,68) if the difference (44) between the expected (TD) and nominal (TC) dwell times is beyond a predetermined error limit (58,60).

9 Claims, 2 Drawing Sheets

IGNITION COIL CURRENT MONITORING

BACKGROUND OF THE INVENTION

1. Field of the Invention

The present invention relates to the monitoring of current drawn by an ignition coil for a spark ignition engine, and in particular to circuitry and a method for detecting a malfunction in the charging of an ignition coil or its associated drive circuitry.

2. Description of the Related Art

Ignition coil circuitry typically fails either because of a short circuit, for example in leads between a coil driver and the coil itself, or because of an open circuit, for example a break in a winding of the coil.

If either of these conditions happens, the coil will not be charged, and a cylinder will not fire at the desired time. Such faults may be intermittent, and may therefore be difficult to detect using conventional means, for example during routine servicing of a motor vehicle engine. Even when the fault is permanent, it is not possible to tell simply from the misfiring of a cylinder whether the fault is due to an open or a short circuit.

One document concerned with detecting a short circuit is EP 0 502 549-A2, in which a method is disclosed that measures three voltages—the battery supply voltage, and the voltage at either end of a charging coil. Differences between the voltages can then be used to determine if the ignition coil is short-circuited. Such a system is not suitable for detecting more subtle modes of failure, for example those falling short of a complete short or open circuit, and so are not very useful in engine performance diagnosis.

Occasionally, a fault may not be so serious so as to cause misfiring under normal conditions, but may cause misfiring if other engine parameters deviate from normal. For example, high coil resistance may reduce the coil charge, but until the battery voltage falls below a certain level, the charge is still adequate to fire the cylinder. Such a minor fault may become progressively worse, and it would therefore be useful, for example during servicing, to have advance warning of degradation in coil charging.

SUMMARY OF THE INVENTION

Accordingly, the invention provides an electronic circuit for detecting an error in the charging of an ignition coil for a spark ignition engine, comprising: means to measure the voltage of a battery for charging the coil; means to determine according to the measured battery voltage a nominal dwell time for charging fully the coil prior to discharge of the coil; means to measure an amount of current drawn by the coil over a time less than the time taken to charge fully the coil; means to extrapolate from the measured current a calculated expected dwell time to charge fully the coil; and means to indicate an error condition if the difference between the expected and nominal dwell times is beyond a predetermined error limit.

The circuitry may therefore comprise a memory in which is stored a look-up table with a set of expected nominal dwell times for full charging of a coil for given various nominal battery voltages. Means may also be provided to measure other engine parameters, such as the speed of the engine, so that the nominal dwell time is varied according to the parameter or engine speed.

Although the battery voltage is the main variable which causes variability in the coil charge during a set dwell time, other parameters may affect coil performance. For example, coil resistance will increase as the coil is heated. Therefore, the electronic circuit may comprise means to measure the temperature of a coil, for example a thermocouple. Then, the means to determine a nominal dwell time may additionally use the measured temperature as a variable in the determination.

If a fault is detected, then it may become desirable to disable the firing of a cylinder in order to protect other components, such as coil driver circuitry. Therefore the electronic circuit may comprise means to disable charging of a coil if an error condition is indicated.

However, if the fault is not serious, then it may be better not to disable the cylinder. Therefore the means to disable charging of a coil may be arranged so that it does not disable the charging of a coil unless the difference between the expected and nominal dwell times is beyond an upper error limit.

Circuitry according to the invention as described above may be incorporated in a spark ignition engine, for example in a motor vehicle.

Also according to the invention, there is provided a method of detecting an error in the charging of an ignition coil for a spark ignition engine, the method comprising the steps of:

a) measuring the voltage of a battery for charging the coil;

b) determining according to the measured battery voltage a nominal dwell time for charging fully the coil prior to discharge of the coil;

c) measuring an amount of current drawn by the coil over a time less than the time taken to charge fully the coil;

d) extrapolating from the measured current a calculated expected dwell time to charge fully the coil; and e) indicating an error condition if the difference between the expected and calculated dwell times is beyond a predetermined error limit.

DETAILED DESCRIPTION OF THE PREFERRED EMBODIMENT

Figure 1:
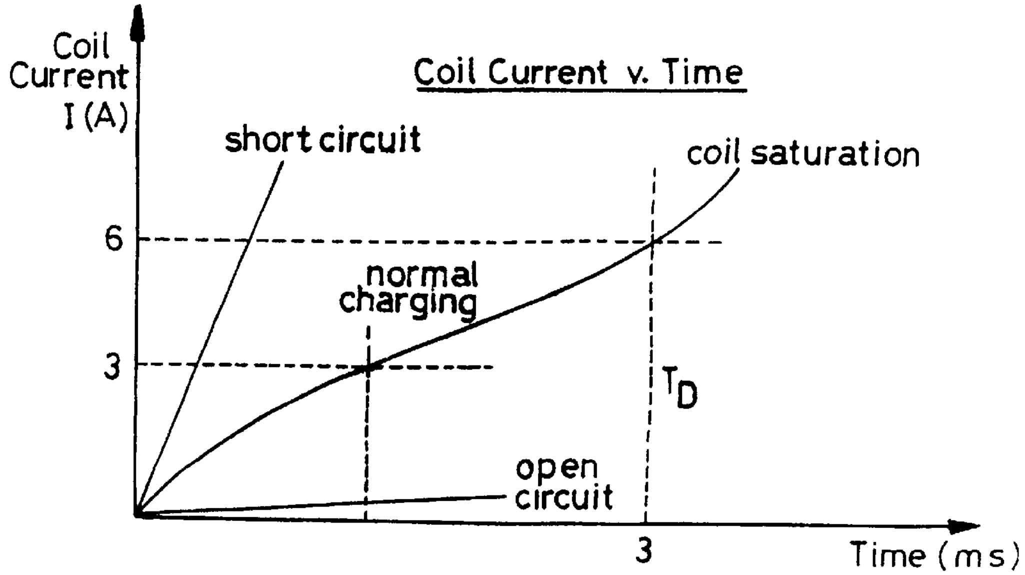
FIG. 1 is a plot of the normal charging characteristic of an ignition coil, compared with lines indicative of short circuit and open circuit conditions.

FIG. 1 shows a plot of coil current against time, for a conventional motor vehicle ignition coil. The coil charges approximately exponentially up until a full charge level at a current of about 6 A after a charging time of about 3 ms. In a short circuit condition, the current will rise relatively rapidly. In an open circuit condition, the current will rise relatively slowly, if at all. Therefore, by measuring the time taken until the current has reached an approximate "half-charge" level, here 3 A, it is possible to calculate an expected dwell time TD until the coil is fully charged, and hence determine if the coil is performing normally.

Figure 2:
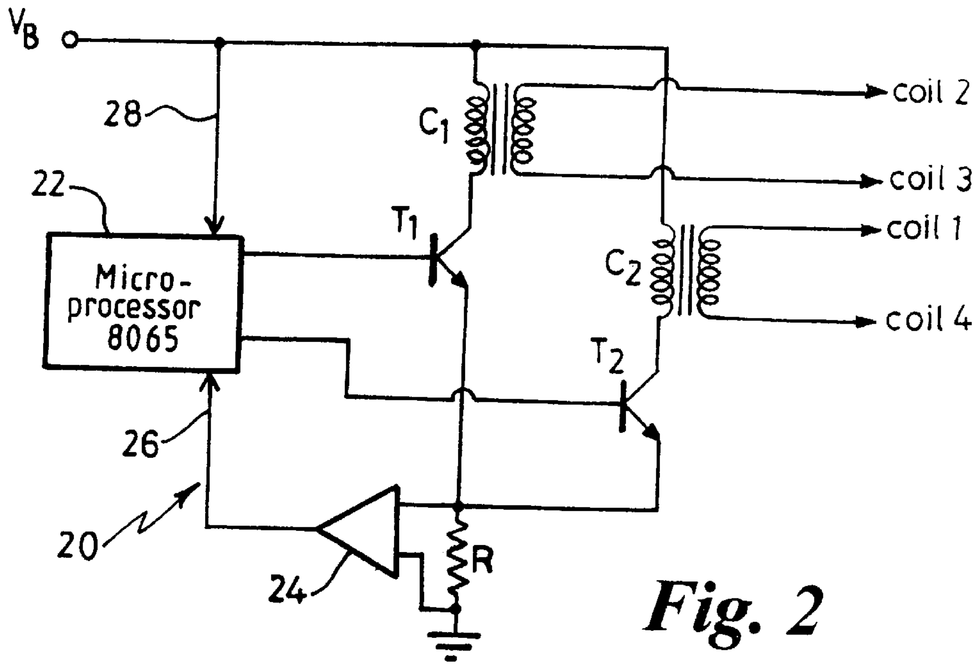
FIG. 2 is a circuit diagram of part of an ignition coil driver circuit according to the invention.

FIG. 2 shows part of a coil driver circuit 20, based on an Intel 8065 microprocessor 22, which is part of an otherwise conventional engine management module (not shown). The microprocessor is fed in a conventional manner with signals (not shown) from which the correct timing can be determined for the firing of the cylinders.

The microprocessor 22 has a pair of outputs, each of which drives a similar insulated gate bipolar power transistor T1, T2, which drive a pair of ignition coils C1, C2 for a four-cylinder engine in a conventional manner.

Since each of the transistors T1, T2 is driven in turn, the current through these is passed through a high power resistor R with a resistance of about 40 mΩ. The voltage generated across resistor R is used as an input by a comparator 24, which generates a control signal 26 which goes high when the current through one of the coils C1, C2 has reached 3A.

The control signal 26 is then used as an input to the microprocessor 22, and since the time at which charging starts is known by software running in the microprocessor, the time to "half-charge" may be measured.

The microprocessor will be conventionally powered by a 5 V dc stabilized power supply, and receives as an input a line 28 carrying the nominal 12 V dc vehicle battery supply VB. An analog-to-digital (A/D) converter on-board the microprocessor chip provides a digital value corresponding to a measured battery voltage VB.

Figure 3:
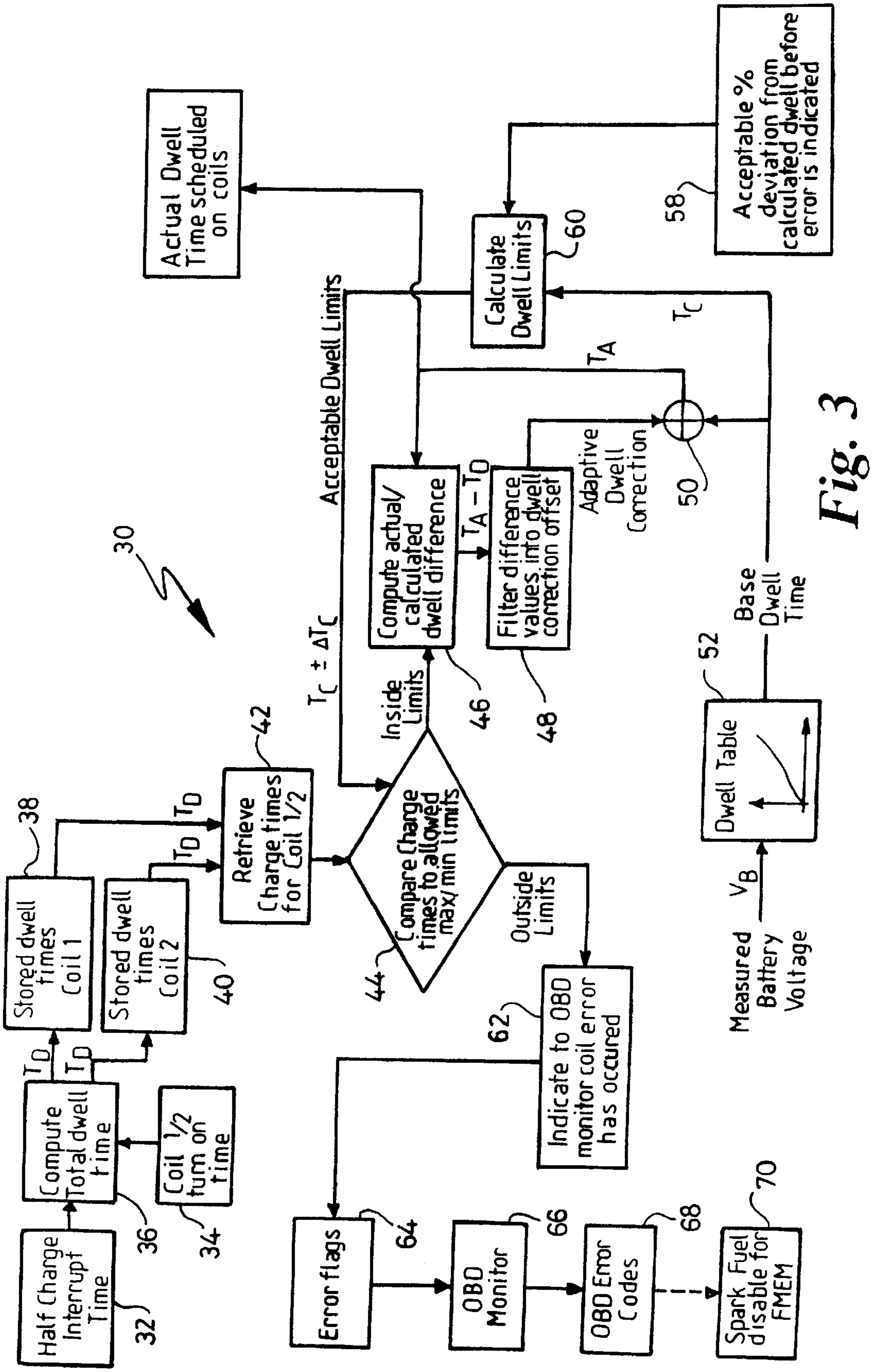
FIG. 3 is a flow diagram showing the steps involved in determining whether or not an error condition has arisen in the driving of an ignition coil.

The operation of the circuit may now be further understood with reference also to the flow chart 30 of FIG. 3. When the microprocessor 22 detects the "half-charge" time, the program is interrupted 32, and the coil C1, C2 turn on time 34 is retrieved from memory to calculate 36 the total expected dwell time TD. This part of the software operates continuously, and the computed time is stored 38,40 in an array in memory for each of the coils C1, C2.

The software periodically, on a cycle time of approximately 50 ms, retrieves 42 the array of TD values and then compares 44 the calculated expected dwell times TD computed from the measured "half-charge" times with a nominal base dwell time TC, and in particular with predetermined error limits ±ΔTC within which the coil charging rate is deemed to be normal.

If the expected dwell time TD is within normal bounds, then the difference TA-TD between the expected and computed nominal dwell times is calculated 46, and is filtered 48 into a dwell correction offset. This offset may be limited to some maximum level, for example up to ±20% of a nominal expected dwell time. The offset is then added 50 onto the nominal base dwell time TC which is determined in a look-up table 52 according to the measured battery voltage VB, resulting in an adaptive dwell time TA. As indicated in FIG. 3, the adaptive dwell time TA may then optionally be used as an actual dwell time by appropriate coil drive circuitry to drive the coils with a more accurate dwell time corrected for the characteristics of the coil being used.

The acceptable percentage deviation ±ΔTC from the computed nominal base dwell time TC before an error is indicated 58 is a value or values recalled from memory. This parameter ±ΔTC may be selected according to the amount of variation within which the coil charging is deemed to be within normal bounds. For a motor vehicle engine, this may be ±50%. The acceptable variation ±ΔTC is then added 60 to the determined nominal base dwell time TC, and fed back into the part of the calculation in which the next expected dwell time TD is used from the array of calculated dwell time values.

If the expected dwell time TD is outside the normal bounds, then microprocessor software indicates to on-board diagnostics (OBD) 62 running within the microprocessor 22 that an error condition has occurred. This particular expected dwell time TD is therefore not used in the part of the calculation 46,48 in which the adaptive dwell correction is summed with the nominal base dwell time TC. Rather, the software proceeds to measure the next expected dwell time TD, while an error flag 64 is set and passed to an OBD monitor 66, which generates an OBD error code 68. In the case of a motor vehicle, this code will conform to internationally recognized standards and may be used during servicing of a vehicle by any motor dealer having the appropriate test equipment.

Optionally, the spark, and possibly also the fuel supply, may then be disabled 70 for a particular cylinder for which the coil charging fault was detected.

An electronic circuit as described above may be used to detect and react to errors in a motor vehicle spark ignition engine. In the case of an error, damage to the vehicle components, such as electronic circuitry, may be avoided in the cases of a short or open circuits. Fuel supply may optionally be shut down, thereby avoiding the possibility of damage to a catalytic converters from excess hydrocarbons in the exhaust stream. In particular, the electronic circuitry uses little additional hardware, for example the resistor R and comparator 24, beyond that commonly used in known electronic ignition systems within an engine management module, and is therefore relatively inexpensive to implement.

What is claimed is:

1. An electronic circuit (20) for detecting an error in the charging of an ignition coil (C1,C2) for a spark ignition engine, comprising: means (22,28) to measure the voltage (VB) of a battery for charging the coil (C1,C2); means (22,52) to determine according to the measured battery voltage (VB) a nominal dwell time (TC) for charging fully the coil prior to discharge of the coil; means (24,32,34) to measure an amount of current drawn by the coil (C1,C2) over a time less than the time taken to charge fully the coil (C1,C2); means (22,36) to extrapolate from the measured current a calculated expected dwell time (TD) to charge fully the coil (C1,C2); and means (22,44,62,64,66,68) to indicate an error condition if the difference (44) between the expected (TD) and nominal (TC) dwell times is beyond a predetermined error limit (58,60).

2. An electronic circuit (20) as claimed in claim 1, comprising means to measure the temperature of a coil (C1,C2), the means (22,52) to determine the nominal dwell time (TC) using the measured temperature as a variable in the determination of the nominal dwell time.

3. An electronic circuit (20) as claimed in claim 2, comprising means (70) to disable charging of a coil (C1,C2) if an error condition (68) is indicated.

4. An electronic circuit (20) as claimed in claim 3, in which the means (70) to disable charging of a coil (C1,C2) does not disable the charging of a coil (C1,C2) unless the difference (44) between the expected (TD) and nominal (TC) dwell times is beyond an upper error limit.

5. An electronic circuit (20) as claimed in claim 4 comprising means (66,68) to store the result of an indicated error which may be read out at a later time.

6. An electronic circuit (20) as claimed in claim 1, comprising means (70) to disable charging of a coil (C1,C2) if an error condition (68) is indicated.

7. An electronic circuit (20) as claimed in claim 6, in which the means (70) to disable charging of a coil (C1,C2) does not disable the charging of a coil (C1,C2) unless the difference (44) between the expected (TD) and nominal (TC) dwell times is beyond an upper error limit.

8. An electronic circuit (20) as claimed in claim 7, comprising means (66,68) to store the result of an indicated error which may be read out at a later time.

9. A method of detecting an error in the charging of an ignition coil (C1,C2) for a spark ignition engine, the method comprising the steps of:

a) measuring the voltage (VB) of a battery for charging the coil (C1,C2);

b) determining (22,28,52) according to the measured battery voltage (VB) a nominal dwell time (TC) for charging fully the coil (C1,C2) prior to discharge of the coil (C1,C2);

c) measuring (24,32,34) an amount of current drawn by the coil (C1,C2) over a time less than the time taken to charge fully the coil (C1,C2);

d) extrapolating (22,36) from the measured current a calculated expected dwell time (TD) to charge fully the coil (C1,C2); and e) indicating an error condition (62,64,66,68) if the difference (44) between the expected (TD) and nominal (TC) dwell times is beyond a predetermined error limit (58,60).

* * * * *